United States Patent
Kreupl et al.

(10) Patent No.: US 8,237,146 B2
(45) Date of Patent: Aug. 7, 2012

(54) MEMORY CELL WITH SILICON-CONTAINING CARBON SWITCHING LAYER AND METHODS FOR FORMING THE SAME

(75) Inventors: Franz Kreupl, Mountain View, CA (US); Jingyan Zhang, Santa Clara, CA (US); Huiwen Xu, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 112 days.

(21) Appl. No.: 12/711,810

(22) Filed: Feb. 24, 2010

(65) Prior Publication Data

US 2011/0204474 A1 Aug. 25, 2011

(51) Int. Cl.
| | | |
|---|---|---|
| H01L 47/00 | (2006.01) | |
| H01L 27/108 | (2006.01) | |
| H01L 29/94 | (2006.01) | |
| H01L 21/02 | (2006.01) | |
| H01L 21/20 | (2006.01) | |
| H01L 21/00 | (2006.01) | |

(52) U.S. Cl. ............ 257/4; 257/296; 257/303; 257/532; 257/E21.008; 257/E29.343; 257/E45.002; 438/396; 438/482

(58) Field of Classification Search ............... 257/4, 296, 257/303, 532, E21.008, E29.343, E45.002; 438/396, 482
See application file for complete search history.

(56) References Cited

U.S. PATENT DOCUMENTS

| | | |
|---|---|---|
| 4,599,705 A | 7/1986 | Holmberg et al. |
| 5,406,509 A | 4/1995 | Ovshinsky et al. |
| 5,687,112 A | 11/1997 | Ovshinsky |
| 5,751,012 A | 5/1998 | Wolsteinholme et al. |
| 5,825,046 A | 10/1998 | Czubatyj et al. |
| 5,831,276 A | 11/1998 | Gonzalez et al. |
| 5,915,167 A | 6/1999 | Leedy |
| 5,952,671 A | 9/1999 | Reinberg et al. |
| 6,071,597 A * | 6/2000 | Yang et al. ............ 428/209 |
| 6,100,193 A | 8/2000 | Suehiro et al. |
| 6,114,713 A | 9/2000 | Zahorik |
| 6,214,107 B1 | 4/2001 | Kitabatake |
| 6,369,431 B1 | 4/2002 | Gonzalez et al. |

(Continued)

FOREIGN PATENT DOCUMENTS

EP 0 028 707 5/1981

(Continued)

OTHER PUBLICATIONS

Sin, C-Y et al., "Resist trimming in high-density CF4/02 Plasmas for sub-0.1 [mu]m device fabrication", Jour. Vacuum Sci. & Techno. B (Microelectronics and Nanometer Structures) AIP for American Vacuum Soc. USA, vol. 20, No. 5, pp. 1974-1981, 2002.

(Continued)

*Primary Examiner* — Charles Garber
*Assistant Examiner* — Ron Pompey
(74) *Attorney, Agent, or Firm* — Dugan & Dugan, PC

(57) ABSTRACT

In a first aspect, a method of forming a memory cell is provided that includes (1) forming a metal-insulator-metal (MIM) stack, the MIM stack including (a) a first conductive carbon layer; (b) a low-hydrogen, silicon-containing carbon layer above the first conductive carbon layer; and (c) a second conductive carbon layer above the low-hydrogen, silicon-containing carbon layer; and (2) forming a steering element coupled to the MIM stack. Numerous other aspects are provided.

55 Claims, 11 Drawing Sheets

U.S. PATENT DOCUMENTS

| | | | |
|---|---|---|---|
| 6,388,933 | B2 | 5/2002 | Marr |
| 6,563,220 | B2 | 5/2003 | Gonzalez et al. |
| 6,643,159 | B2 | 11/2003 | Fricke et al. |
| 6,670,713 | B2 | 12/2003 | Gonzalez et al. |
| 6,744,088 | B1 | 6/2004 | Dennison |
| 6,841,846 | B1 | 1/2005 | Chen et al. |
| 6,885,021 | B2 | 4/2005 | Apodaca et al. |
| 6,937,507 | B2 | 8/2005 | Chen |
| 6,952,030 | B2 | 10/2005 | Herner et al. |
| 6,960,495 | B2 | 11/2005 | Vyvoda et al. |
| 6,984,561 | B2 | 1/2006 | Herner et al. |
| 6,995,422 | B2 | 2/2006 | Herner et al. |
| 7,009,275 | B2 | 3/2006 | Herner et al. |
| 7,026,212 | B2 | 4/2006 | Herner et al. |
| 7,084,062 | B1 | 8/2006 | Avanzino et al. |
| 7,176,064 | B2 | 2/2007 | Herner |
| 7,205,562 | B2 | 4/2007 | Wicker |
| 7,238,607 | B2 | 7/2007 | Dunton et al. |
| 7,259,038 | B2 | 8/2007 | Scheuerlein et al. |
| 7,265,049 | B2 | 9/2007 | Herner et al. |
| 7,271,440 | B2 | 9/2007 | Harshfield |
| 7,285,464 | B2 | 10/2007 | Herner et al. |
| 7,301,191 | B1 | 11/2007 | Tombler et al. |
| 7,345,296 | B2 | 3/2008 | Tombler, Jr. et al. |
| 7,361,586 | B2 | 4/2008 | Adem et al. |
| 7,405,465 | B2 | 7/2008 | Herner |
| 7,417,245 | B2 | 8/2008 | Happ et al. |
| 7,426,128 | B2 | 9/2008 | Scheuerlein |
| 7,483,285 | B2 | 1/2009 | Furukawa et al. |
| 7,575,984 | B2 | 8/2009 | Radigan |
| 7,602,042 | B2 | 10/2009 | Ahn et al. |
| 7,705,343 | B2 | 4/2010 | Suh et al. |
| 7,728,405 | B2 | 6/2010 | Kreupl |
| 8,039,919 | B2 * | 10/2011 | Moon et al. ............ 257/485 |
| 2003/0073295 | A1 | 4/2003 | Xu |
| 2004/0159835 | A1 | 8/2004 | Krieger et al. |
| 2004/0251551 | A1 | 12/2004 | Hideki |
| 2005/0052915 | A1 | 3/2005 | Herner et al. |
| 2005/0158950 | A1 | 7/2005 | Scheuerlein et al. |
| 2005/0226067 | A1 | 10/2005 | Herner et al. |
| 2006/0046407 | A1 | 3/2006 | Juengling |
| 2006/0097342 | A1 | 5/2006 | Parkinson |
| 2006/0118782 | A1 | 6/2006 | Zettl et al. |
| 2006/0175596 | A1 | 8/2006 | Happ et al. |
| 2006/0250836 | A1 | 11/2006 | Herner |
| 2006/0258109 | A1 | 11/2006 | Juengling |
| 2006/0273298 | A1 | 12/2006 | Petti |
| 2007/0034936 | A1 | 2/2007 | Van Schaijk et al. |
| 2007/0123053 | A1 | 5/2007 | Kim et al. |
| 2007/0190722 | A1 | 8/2007 | Herner |
| 2008/0017894 | A1 | 1/2008 | Happ et al. |
| 2008/0070162 | A1 * | 3/2008 | Ufert ............ 430/290 |
| 2008/0116441 | A1 | 5/2008 | Raghuram |
| 2008/0173858 | A1 | 7/2008 | An et al. |
| 2008/0217732 | A1 | 9/2008 | Kreupl |
| 2009/0168491 | A1 | 7/2009 | Schricker |
| 2009/0201715 | A1 | 8/2009 | Kreupl |
| 2009/0257265 | A1 | 10/2009 | Chen et al. |
| 2009/0257270 | A1 | 10/2009 | Schricker |
| 2009/0262572 | A1 | 10/2009 | Krusin-Elbaum |
| 2009/0294832 | A1 | 12/2009 | Kakoschke et al. |
| 2010/0006811 | A1 | 1/2010 | Xu et al. |
| 2010/0006812 | A1 | 1/2010 | Xu |
| 2010/0012914 | A1 | 1/2010 | Xu et al. |
| 2010/0032638 | A1 | 2/2010 | Xu |
| 2010/0032639 | A1 * | 2/2010 | Xu ............ 257/2 |
| 2010/0032640 | A1 | 2/2010 | Xu |
| 2010/0102291 | A1 | 4/2010 | Xu |
| 2010/0108976 | A1 | 5/2010 | Jayasekara et al. |
| 2011/0037045 | A1 | 2/2011 | Fukumizu et al. |
| 2011/0117679 | A1 | 5/2011 | Lee et al. |
| 2011/0204474 | A1 * | 8/2011 | Kreupl et al. ............ 257/532 |
| 2011/0254126 | A1 * | 10/2011 | Kreupl et al. ............ 257/532 |

FOREIGN PATENT DOCUMENTS

| | | |
|---|---|---|
| EP | 1 892 722 | 2/2008 |
| EP | 1 916 722 | 4/2008 |
| JP | 2009 218259 | 9/2009 |
| WO | WO 2004/070735 | 8/2004 |
| WO | WO 2006/078505 A2 | 7/2006 |
| WO | WO 2008/078197 | 7/2008 |
| WO | WO 2009/043023 A2 | 4/2009 |
| WO | WO 2009/088889 | 7/2009 |
| WO | WO 2009/110120 | 9/2009 |
| WO | WO 2009/126846 | 10/2009 |
| WO | WO 2009/126891 | 10/2009 |
| WO | WO 2010/017428 | 2/2010 |

OTHER PUBLICATIONS

Eyoum, M-A et al., "Ashing Technique for Nano-Gap Fabrication of Electrostatic Transducers", Materials Research Society Symposium Proceedings; [Materials Research Society Symposium Proceedings], Materials Research Society, USA, vol. EXS-02, pp. 145-147, 2003.

Li et al., "Electronic Two-Terminal Bistable Graphitic Memories", Nature Materials, vol. 7, 2008, pp. 966-971.

Maxwell, U.S. Appl. No. 12/703,907, filed Feb. 11, 2010.

Li et al., U.S. Appl. No. 12/631,913, filed Dec. 7, 2009.

Li et al., U.S. Appl. No. 12/714,359, filed Feb. 26, 2010.

Kreupl et al., "Carbon-Based Resistive Memory", Jun. 26, 2008, IEDM 2008, pp. 1-4.

Gateru et al., "Memory Switching in Ion Bombarded Amorphous Silicon Carbide Thin Film Devices", 2003, Materials Research Society, Mat. Res. Soc. Symp. Proc., vol. 742, pp. 79-83.

Shannon et al., "Memory Switching in Amorphous Silicon-Rich Silicon Carbide", Oct. 28, 1999, Electronics Letters, vol. 35, No. 22, pp. 1976-1978.

Kreupl et al., U.S. Appl. No. 12/760,156, filed Apr. 14, 2010.

Invitation to Pay Additional Fees and Communication Relating to the Results of the Partial International Search of counterpart International Application No. PCT/US2011/024162 dated May 31, 2011.

Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.

Takai et al.,"Structure and Electronic Properties of a Nongraphitic Disordered Carbon System and its Heat-Treatment Effects", Physical Review B 67, 214202, pp. 214202-1-214202-11, published Jun. 19, 2003.

Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.

Dittmer et al., "Low ambient temperature CVD growth of carbon nanotubes," Appl. Phys. A 84,243-246 (2006), p. 1, published online May 17, 2006.

Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678.

Kong et al., "Integration of a gate electrode into carbon nanotube devices for scanning tunneling microscopy," Appl. Phys. Lett. 86, 2005, pp. 112106-1-112106-3, published online Mar. 8, 2005.

Bhattacharyya, et al., "Switching behaviour and high frequency response of amorphous carbon double-barrier structures", Aug. 2007, Materials Science and Engineering C, Elsevier Science S.A, CH, vol. 27 No. 5-8, pp. 957-960, available online Nov. 13, 2006.

Xu et al., U.S. Appl. No. 12/834,942, filed Jul. 13, 2010.

Xu et al., U.S. Appl. No. 112/835,236, filed Jul. 13, 2010.

International Search Report and Written Opinion of International Application No. PCT/US2011/024162 mailed Aug. 22, 2011.

* cited by examiner

US 8,237,146 B2

MEMORY CELL WITH SILICON-CONTAINING CARBON SWITCHING LAYER AND METHODS FOR FORMING THE SAME

TECHNICAL FIELD

This invention relates to non-volatile memories, and more particularly to a memory cell with a silicon-containing carbon switching layer and methods for forming the same.

BACKGROUND

Non-volatile memories formed from carbon-based reversible resistance-switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity-switching material.

However, fabricating memory devices from carbon-based switching materials is technically challenging, and improved methods of forming memory devices that employ carbon-based switching materials are desirable.

SUMMARY

In a first aspect of the invention, a method of forming a memory cell is provided, the method including: (1) forming a metal-insulator-metal ("MIM") stack, the MIM stack including: (a) a first conductive carbon layer; (b) a low-hydrogen, silicon-containing carbon layer above the first conductive carbon layer; and (c) a second conductive carbon layer above the low-hydrogen, silicon-containing carbon layer; and (2) forming a steering element coupled to the MIM stack.

In a second aspect of the invention, a method of forming a memory cell is provided, the method including: (1) forming a MIM stack by: (a) forming a first conductive carbon layer; (b) forming a low-hydrogen, silicon-containing carbon layer over the first conductive carbon layer; and (c) forming a second conductive carbon layer over the low-hydrogen, silicon-containing carbon layer; and (2) forming a steering element coupled to the MIM stack.

In a third aspect of the invention, a method of forming a memory cell is provided, the method including: (1) forming a MIM stack by: (a) forming a low-hydrogen conductive carbon layer; and (b) implanting silicon into the low-hydrogen conductive carbon layer to form a first conductive carbon layer, a low-hydrogen, silicon-containing carbon layer above the first conductive carbon layer and a second conductive carbon layer above the low-hydrogen, silicon-containing carbon layer; and (2) forming a steering element coupled to the MIM stack.

In a fourth aspect of the invention, a memory cell is provided that includes: (1) a MIM stack, the MIM stack including: (a) a first conductive carbon layer; (b) a low-hydrogen, silicon-containing carbon layer above the first conductive carbon layer; and (c) a second conductive carbon layer above the low-hydrogen, silicon-containing carbon layer; and (2) a steering element coupled to the MIM stack.

In a fifth aspect of the invention, a memory cell is provided that includes: (1) a first conductive rail; (2) a MIM stack formed above the first conductive rail, the MIM stack including: (a) a first conductive carbon layer, the first conductive carbon layer having a resistivity of not more than about 100 milliOhm-cm; (b) a low-hydrogen, silicon-containing carbon layer above the first conductive carbon layer, the low-hydrogen, silicon-containing carbon layer comprises at least about 30 atm % silicon; and (c) a second conductive carbon layer above the low-hydrogen, silicon-containing carbon layer, the second conductive carbon layer having a resistivity of not more than about 100 milliOhm-cm; (3) a steering element formed above the first conductive rail and in series with the MIM stack; and (4) a second conductive rail above the MIM stack and steering element.

In a sixth aspect of the invention, a method of forming a MIM stack is provided, the method including: (1) forming a first conductive carbon layer; (2) forming a low-hydrogen, silicon-containing carbon layer over the first conductive carbon layer; and (3) forming a second conductive carbon layer over the low-hydrogen, silicon-containing carbon layer.

In a seventh aspect of the invention, a method of forming a MIM stack is provided, the method including: (1) forming a low-hydrogen conductive carbon layer; and (2) implanting silicon into the low-hydrogen conductive carbon layer to form a first conductive carbon layer, a low-hydrogen, silicon-containing carbon layer above the first conductive carbon layer and a second conductive carbon layer above the low-hydrogen, silicon-containing carbon layer.

In an eighth aspect of the invention, a MIM stack is provided that includes: (1) a first conductive carbon layer; (2) a low-hydrogen, silicon-containing carbon layer above the first conductive carbon layer; and (3) a second conductive carbon layer above the low-hydrogen, silicon-containing carbon layer. Numerous other aspects are provided.

Other features and aspects of this invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Figure 1:
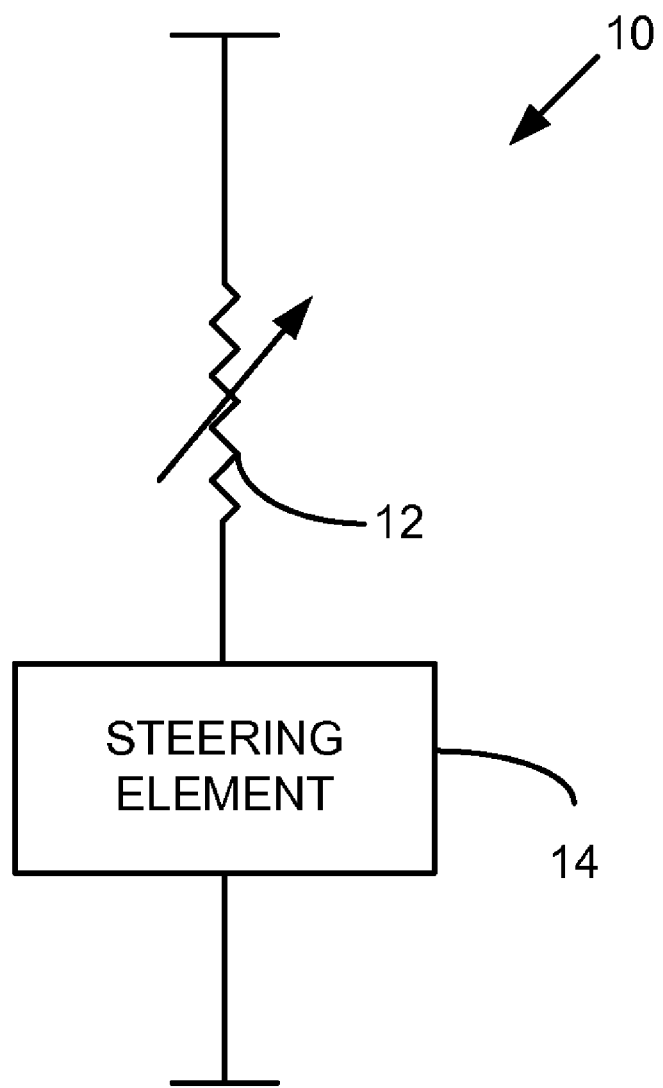
FIG. 1 is a diagram of an exemplary memory cell in accordance with this invention.

Some carbon-based materials have been shown to exhibit reversible resistivity-switching properties that may be suitable for use in non-volatile memories. As used herein, carbon-based read-writeable or "switching" materials generally may include one or more of amorphous carbon containing nanocrystalline graphene (referred to herein as "graphitic carbon"), graphene, graphite, carbon nano-tubes, amorphous diamond-like carbon ("DLC"), silicon carbide, boron carbide and other crystalline forms of carbon, and may also include secondary materials.

Carbon-based switching materials have demonstrated memory switching properties on lab-scale devices with a 100× separation between ON and OFF states and mid-to-high range resistance changes. Such a separation between ON and OFF states renders carbon-based switching materials viable candidates for memory cells in which the carbon-based switching material is coupled in series with vertical diodes, thin film transistors or other steering elements. For example, a MIM stack formed from a carbon-based switching material sandwiched between two metal or otherwise conducting layers may serve as a resistance-switching element for a memory cell. For example, a CNT MIM stack may be integrated in series with a diode or transistor to create a read-writable memory device as described, for example, in the '154 Application.

Attempts to implement carbon-based switching materials in memory devices have proven technically challenging. For instance, carbon-based switching materials may be hard to switch and may require current densities that exceed the capabilities of the electrodes and/or steering element used with the switching material. Further, carbon-based switching material may outgas, shrink and peel during device fabrication.

In exemplary embodiments of this invention, MIM stacks and/or memory cells and arrays are formed using low-hydrogen carbon layers, such as low-hydrogen, silicon-containing carbon layers, and high current density sustaining electrodes. The introduction of silicon into a carbon layer increases the resistivity of the carbon layer, making the carbon layer more compatible with a selection (steering) device used to switch the carbon layer.

As used herein, "a low-hydrogen carbon layer" or "a low-hydrogen, silicon-containing carbon layer" refers to a carbon layer having a hydrogen content of less than about 10%, in some embodiments less than about 5% and in some embodiments between about 1-5%. Exemplary low-hydrogen, silicon-containing carbon layers may have about 30-40 atm % or more silicon. In other embodiments, other amounts of hydrogen or silicon may be present. Low-hydrogen, silicon-containing carbon layers may be formed by numerous methods, such as sputtering a graphite target, sputtering a silicon carbide target, implanting silicon into a low-hydrogen carbon layer, or the like.

Low-hydrogen carbon layers outgas and shrink less during device fabrication, making these films less likely to peel and more suitable for use in memory elements. Carbon and silicon form strong bonds so that silicon will not outgas as easily as other dopants upon heating. Silicon also suppresses $sp^2$ bond formation during heating that would otherwise decrease the resistivity of the resultant carbon film. The presence of silicon also reduces thermal conductivity of the carbon layer, which increases local heating to improve switching.

In exemplary embodiments of this invention, high current density sustaining electrodes may be employed which withstand the high current densities in carbon layer filaments during switching. This allows high current densities to be distributed safely to other metallization layers used in a memory cell. Exemplary high current density sustaining electrodes include carbon layers having primarily $sp^2$ carbon bonds (e.g., at least 50% of the carbon is $sp^2$ bonded carbon), metal carbide layers or the like. In some embodiments, such high current density sustaining electrodes may be used as part of a Schottky diode steering element for a memory cell. These and other embodiments of the invention are described below with reference to FIGS. 1-4E.

Exemplary Inventive Memory Cell

FIG. 1 is a schematic illustration of an exemplary memory cell 10 in accordance with this invention. Memory cell 10 includes a reversible resistivity-switching material 12 coupled to a steering element 14. Reversible resistivity-switching material 12 has a resistivity that may be reversibly switched between two or more states.

For example, reversible resistivity-switching material 12 may be in an initial, low-resistivity state upon fabrication. Upon application of a first voltage and/or current, the material is switchable to a high-resistivity state. Application of a second voltage and/or current may return reversible resistivity-switching material 12 to a low-resistivity state. Alternatively, reversible resistivity-switching material 12 may be in an initial, high-resistivity state upon fabrication that is reversibly switchable to a low-resistivity state upon application of the appropriate voltage(s) and/or current(s). When used in a memory cell, one resistivity state may represent a binary "0," whereas another resistivity state may represent a binary "1", although more than two data/resistivity states may be used.

Numerous reversible resistivity-switching materials and operation of memory cells employing reversible resistivity-switching materials are described, for example, in U.S. patent application Ser. No. 11/125,939, filed May 9, 2005 and titled "Rewriteable Memory Cell Comprising A Diode And A Resistance Switching Material" (the "'939 Application"), which is hereby incorporated by reference herein in its entirety for all purposes.

Steering element 14 may include a thin film transistor, a diode, a metal-insulator-metal tunneling current device, or another similar steering element that exhibits non-ohmic conduction by selectively limiting the voltage across and/or the current flow through reversible resistivity-switching material 12. In this manner, memory cell 10 may be used as part of a two or three dimensional memory array and data may be written to and/or read from memory cell 10 without affecting the state of other memory cells in the array. In some embodiments, steering element 14 may be omitted, and memory cell 10 may be used with a remotely located steering element.

Exemplary embodiments of memory cell 10, reversible resistivity-switching material 12 and steering element 14 are described below with reference to FIGS. 2A-2D.

Exemplary Embodiments of Memory Cells and Memory Arrays

Figure 2A:
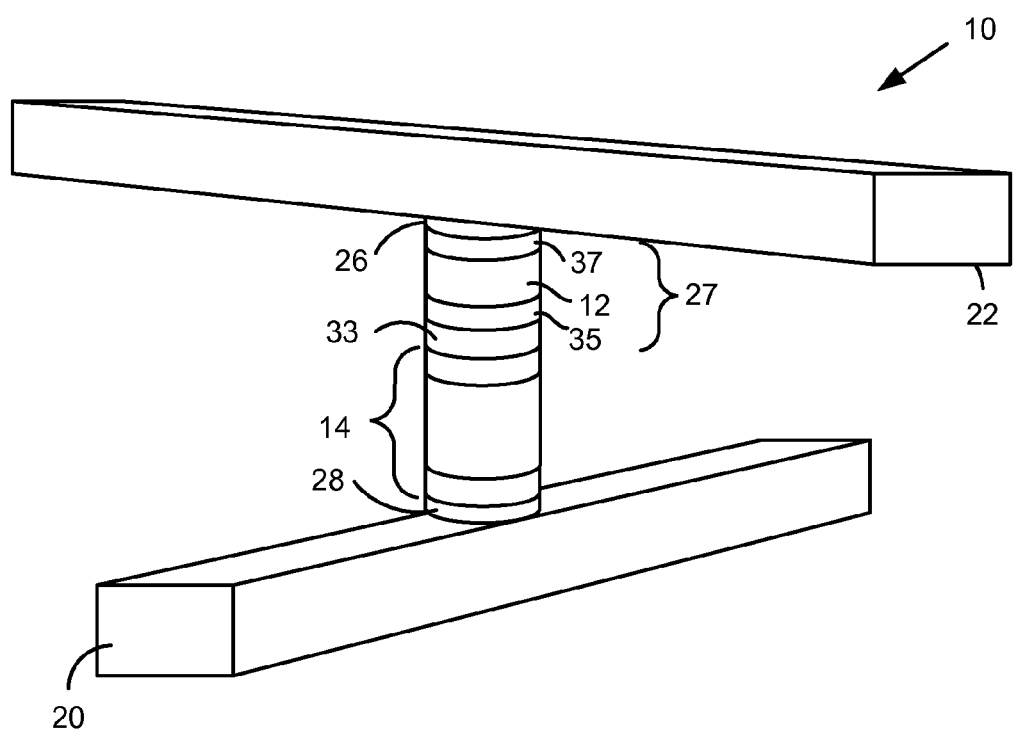
FIG. 2A is a simplified perspective view of an exemplary memory cell in accordance with this invention.

FIG. 2A is a simplified perspective view of an exemplary embodiment of a memory cell 10 in accordance with this invention in which steering element 14 is a diode. Memory cell 10 includes a carbon-based reversible resistivity-switching material 12 ("C-based switching material 12") coupled in series with a diode 14 between a first conductor 20 and a second conductor 22.

In some embodiments, a barrier layer 33 may be formed between C-based switching material 12 and diode 14, and a barrier layer 26 may be formed between C-based switching material 12 and second conductor 22 (forming an MIM stack 27 that may serve as a reversible resistance-switching element). An additional barrier layer 28 may be formed between diode 14 and first conductor 20. Barrier layers 33, 26 and 28 may include titanium, titanium nitride, tantalum, tantalum nitride, tungsten, tungsten nitride, molybdenum, or another similar barrier layer. Barrier layer 26 may be separate from or part of second conductor 22 and barrier layer 28 may be separate from or part of first conductor 20.

In accordance with one or more embodiments of this invention, C-based switching material 12 may be a low-hydrogen, silicon-containing carbon switching layer. The presence of silicon may increase the resistivity of the carbon layer to a level compatible with the current capabilities of steering element 14. In some embodiments, the silicon content of C-based switching material 12 may be about 30-40 atm % or more, and the hydrogen content may be between about 1-5%. The distribution of the silicon in carbon need not be homogeneous, but can have Gaussian or bell-shaped distribution. For example, in some embodiments, the silicon content of C-based switching material 12 may be about 30-40 atm % or more at least in a localized area, with extensions of 1-10 nm. Other silicon and/or hydrogen levels may be present.

C-based switching material 12 is in contact with a first conductive carbon layer 35 and a second conductive carbon layer 37, which serve as high current density sustaining electrodes for MIM stack 27. As will be described further below, conductive carbon layers 35 and 37 allow high current densities produced during switching of C-based switching material 12 to be distributed safely to other metallization layers used in memory cell 10, such as barrier layers 26 and 33, as well as top conductor 22.

Diode 14 may include any suitable diode such as a vertical polycrystalline p-n or p-i-n diode, whether upward pointing with an n-region above a p-region of the diode or downward pointing with a p-region above an n-region of the diode. In some embodiments, diode 14 may be a Schottky diode. Exemplary embodiments of diode 14 are described below with reference to FIGS. 3A-3B.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 20 and/or second conductor 22 to improve device performance and/or aid in device fabrication.

Figure 2B:
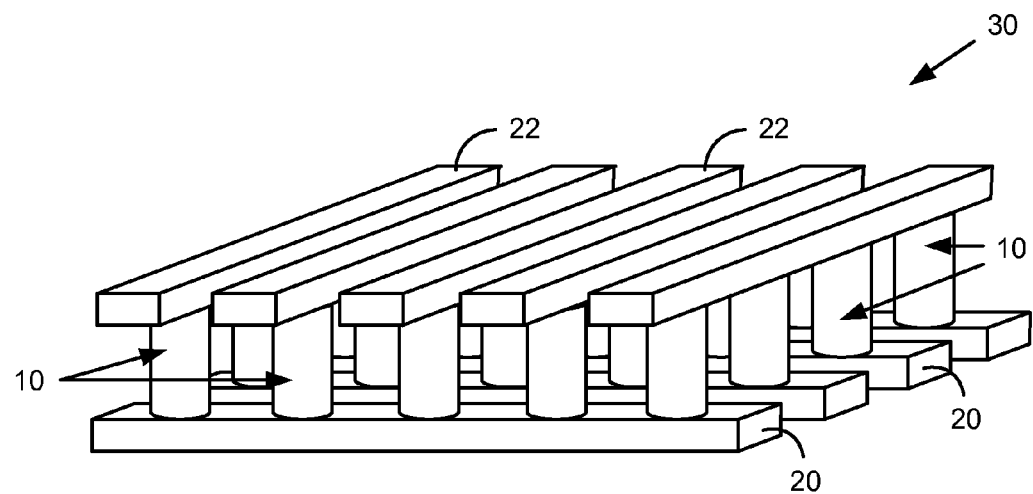
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cells 10 of FIG. 2A. For simplicity, C-based switching material 12, first and second conductive carbon layers 35 and 37, diode 14, and barrier layers 33, 26 and 28 are not separately shown. Memory array 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
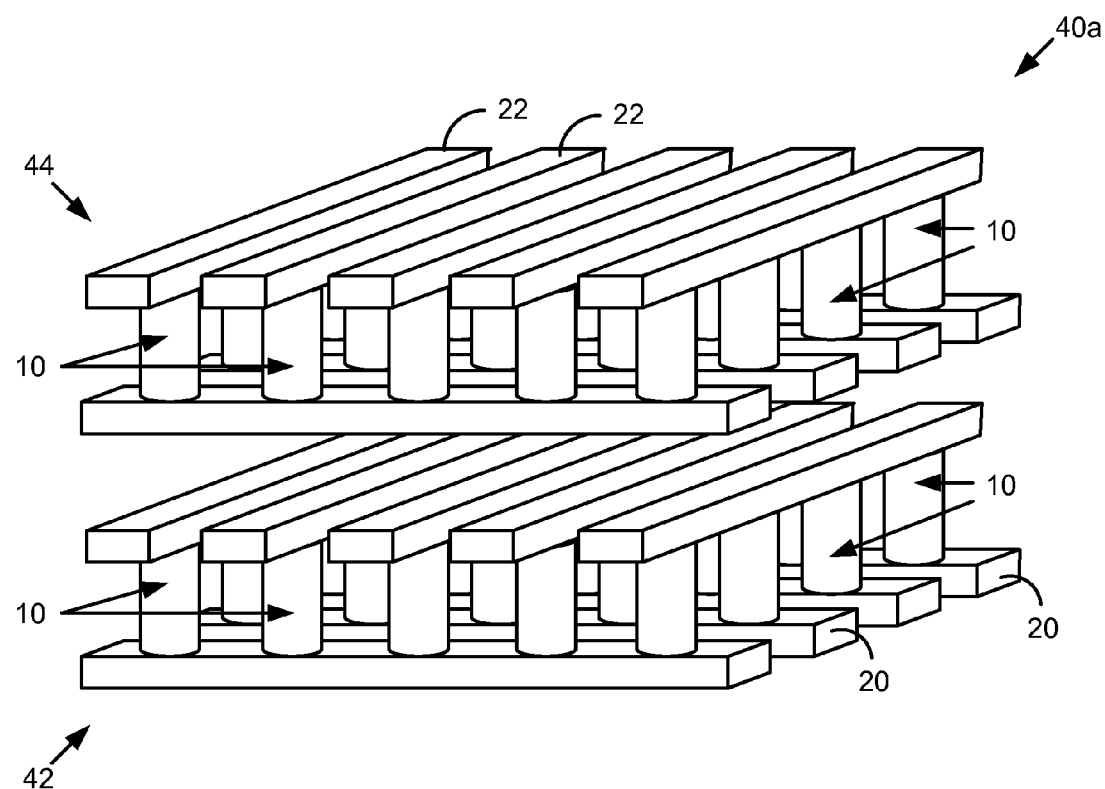
FIG. 2C is a simplified perspective view of a portion of a first exemplary three-dimensional memory array in accordance with this invention.

FIG. 2C is a simplified perspective view of a portion of a monolithic three dimensional memory array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
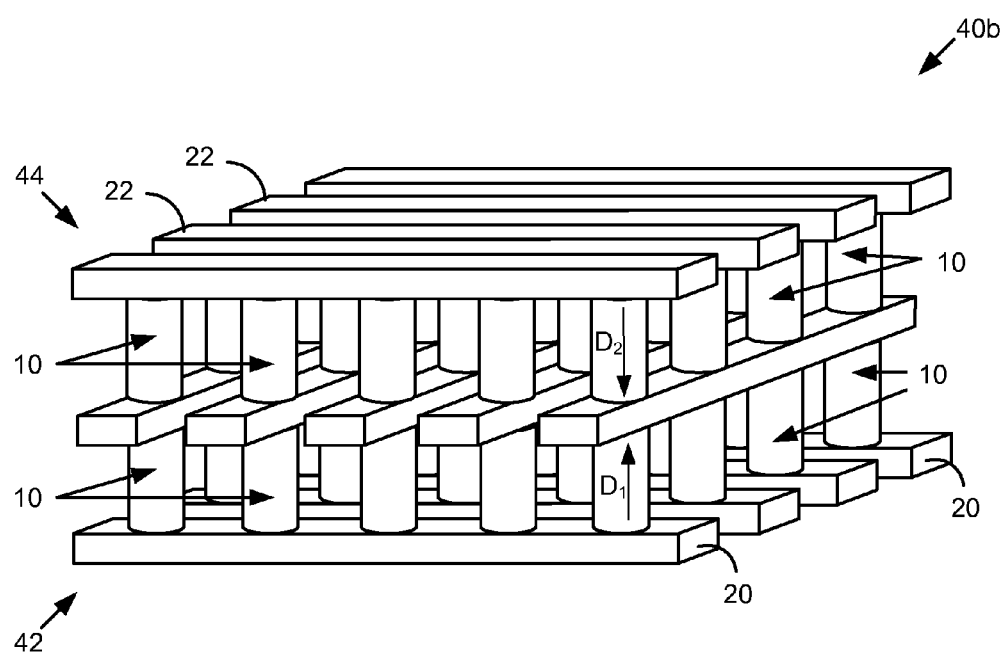
FIG. 2D is a simplified perspective view of a portion of a second exemplary three-dimensional memory array in accordance with this invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the second conductors of a first memory level may be used as the first conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in FIG. 2D, the diodes of first memory level 42 may be upward pointing diodes as indicated by arrow D1 (e.g., with p regions at the bottom of the diodes), whereas the diodes of second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
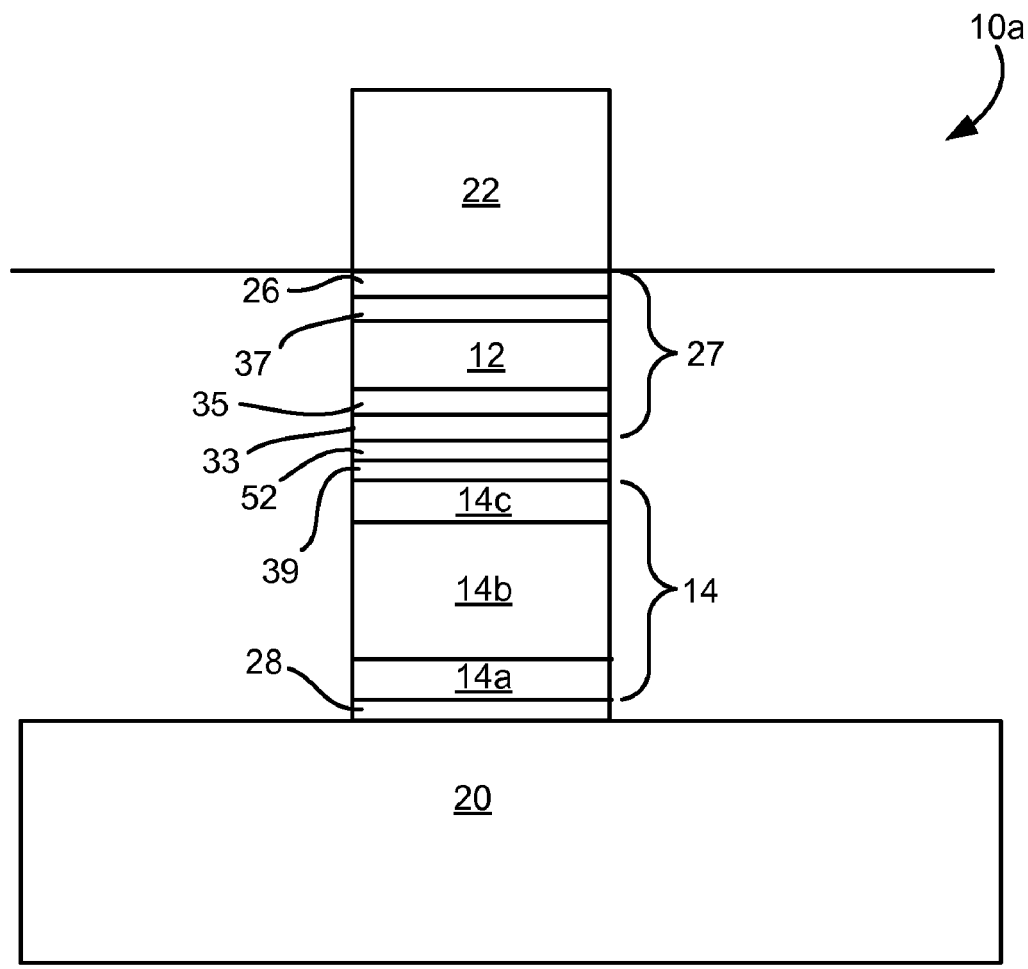
FIG. 3A is a cross-sectional view of a first additional exemplary embodiment of a memory cell in accordance with this invention.

FIG. 3A is a cross-sectional view of a first exemplary embodiment of memory cell 10 of FIG. 1, in accordance with the invention, referred to as memory cell 10a. In particular, memory cell 10a includes MIM stack 27, diode 14, and first and second conductors 20 and 22, respectively. MIM stack 27 includes C-based switching material 12, first conductive carbon layer 35, second conductive carbon layer 37 and in some embodiments barrier layer 33 and/or 26. In the embodiment shown, MIM stack 27 is located above diode 14. However, in other embodiments, MIM stack 27 may be located beneath diode 14. In some embodiments, diode 14 may be located remotely from MIM stack 27 (e.g., not between first and second conductors 20 and 22).

In the embodiment of FIG. 3A, diode 14 may be a vertical p-n or p-i-n diode, which may either point upward or downward. In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above n+ polysilicon region 14a, and a heavily doped p+ polysilicon region 14c above intrinsic region 14b. It will be understood that the locations of the n+ and p+ regions may be reversed.

If diode 14 is fabricated from deposited silicon (e.g., amorphous or polycrystalline), a silicide layer 39 may be formed on diode 14 to place the deposited silicon in a low resistivity state, as fabricated. Such a low resistivity state allows for easier programming of memory cell 10 as a large voltage is not required to switch the deposited silicon to a low resistivity state. For example, a silicide-forming metal layer 52 such as titanium or cobalt may be deposited on p+ polysilicon region 14c and used to form silicide layer 39 (as described below). Additional process details for such an embodiment are described below with reference to FIGS. 4A-4E.

Figure 3B:
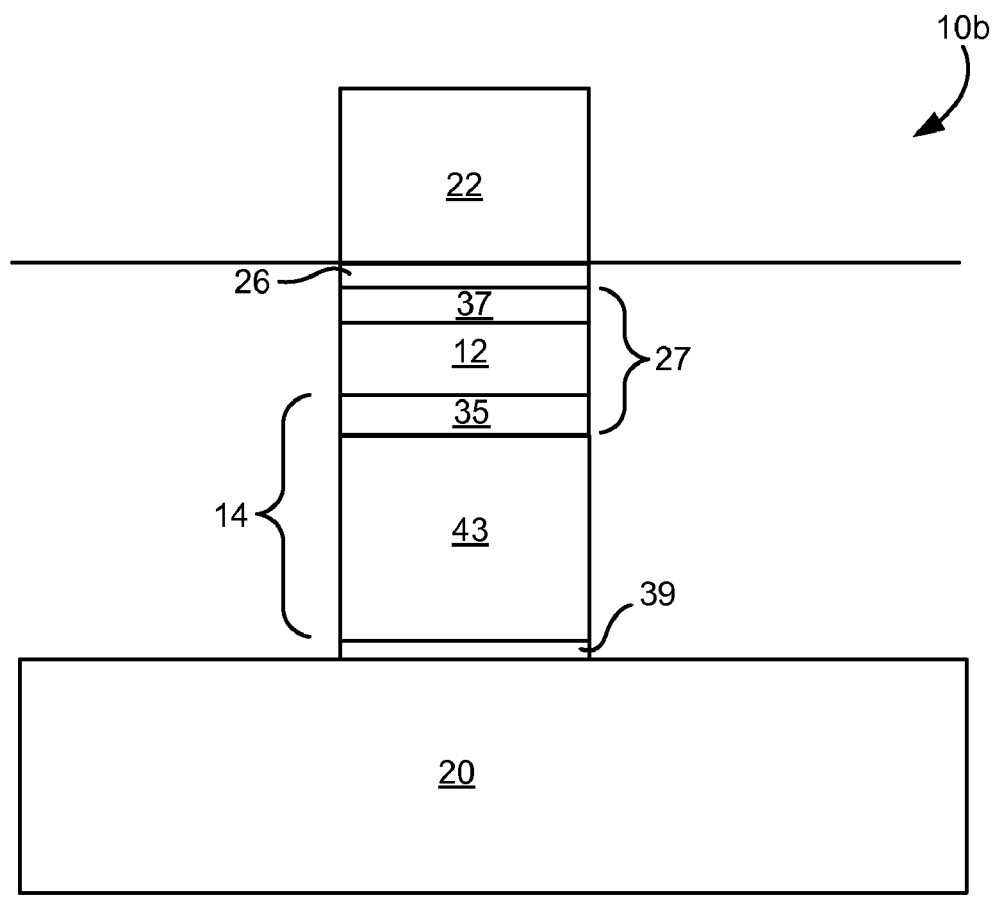
FIG. 3B is a cross-sectional view of a second additional exemplary embodiment of a memory cell in accordance with this invention.

FIG. 3B is a cross-sectional view of an alternative exemplary embodiment of memory cell 10 of FIG. 1, in accordance with the invention, referred to as memory cell 10b. Memory cell 10b of FIG. 3B is similar to memory cell 10a of FIG. 3A with the exception that diode 14 of memory cell 10b is a Schottky diode rather than a p-n or p-i-n diode as in memory cell 10a of FIG. 3A. In particular, barrier layer 33 is removed and semiconductor material 43, such as n-type semiconductor material, is placed in direct contact with first conductive carbon layer 35 to form a Schottky diode 14. Additionally, silicide layer 39 is positioned below semiconductor material 43.

Use of a Schottky diode simplifies fabrication, reducing the number of steps required to form memory cell 10b and the height of memory cell 10b. In some embodiments, first and second conductive carbon layers 35 and 37, respectively, may include conductive carbon layers having primarily $sp^2$ carbon bonds (e.g., at least 50% of the carbon is $sp^2$ bonded carbon), and/or conductive metal carbide layers such as TaC, WC, TaCN, WCN, etc. First and second conductive carbon layers 35 and 37, respectively, are described further below with reference to FIGS. 4A-4E. In one exemplary embodiment, semiconductor material 43 may have a thickness of about 10 to 500 nanometers and an n-type doping concentration of about $10^{16}$ cm$^{-3}$-$10^{18}$ cm$^{-3}$, although other doping levels and/or thicknesses may be used. Generally, the doping concentration will be very high in the region of semiconductor material 43 near silicide layer 39 to guarantee a good ohmic contact between semiconductor material 43 and silicide layer 39.

In the embodiment shown, MIM stack 27 is located above diode 14. However, in other embodiments, MIM stack 27 may be located beneath diode 14. In some embodiments, diode 14 may be located remotely from MIM stack 27 (e.g., not between first and second conductors 20 and 22). Additional process details for MIM stack 27 are provided below with reference to FIGS. 4A-4E.

Exemplary Fabrication Processes for Memory Cells

Referring now to FIGS. 4A-4E, a first exemplary method of forming a memory level in accordance with this invention is described. In particular, FIGS. 4A-4E illustrate an exemplary method of forming a memory level including memory cells 10 of FIG. 2A. As will be described below, the first memory level includes a plurality of memory cells that each include a steering element and a C-based switching material coupled to the steering element. Additional memory levels may be fabricated above the first memory level (as described previously with reference to FIGS. 2C-2D). A memory level including memory cells 10a of FIG. 3A or memory cells 10b of FIG. 3B may be formed using a similar method.

Figure 4A:
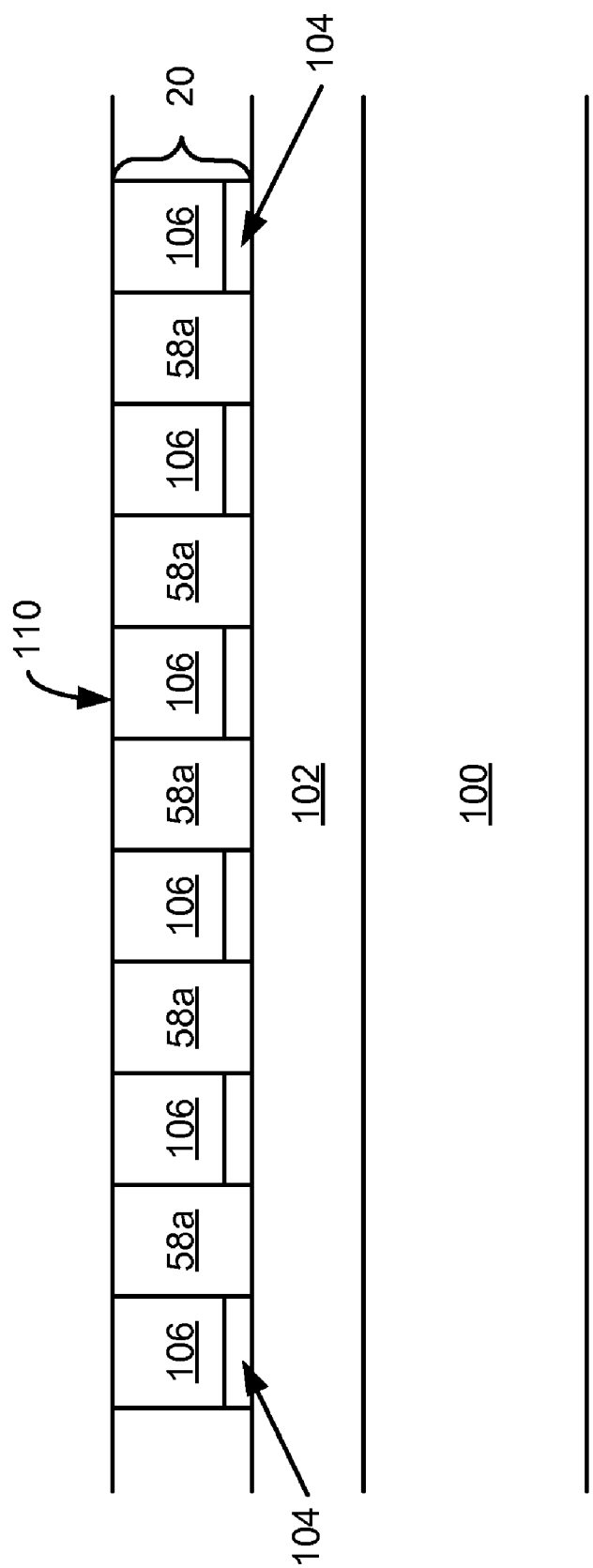
FIGS. 4A-4E illustrate cross-sectional views of a portion of a substrate during an exemplary fabrication of a single memory level in accordance with this invention.

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), physical vapor deposition ("PVD"), etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
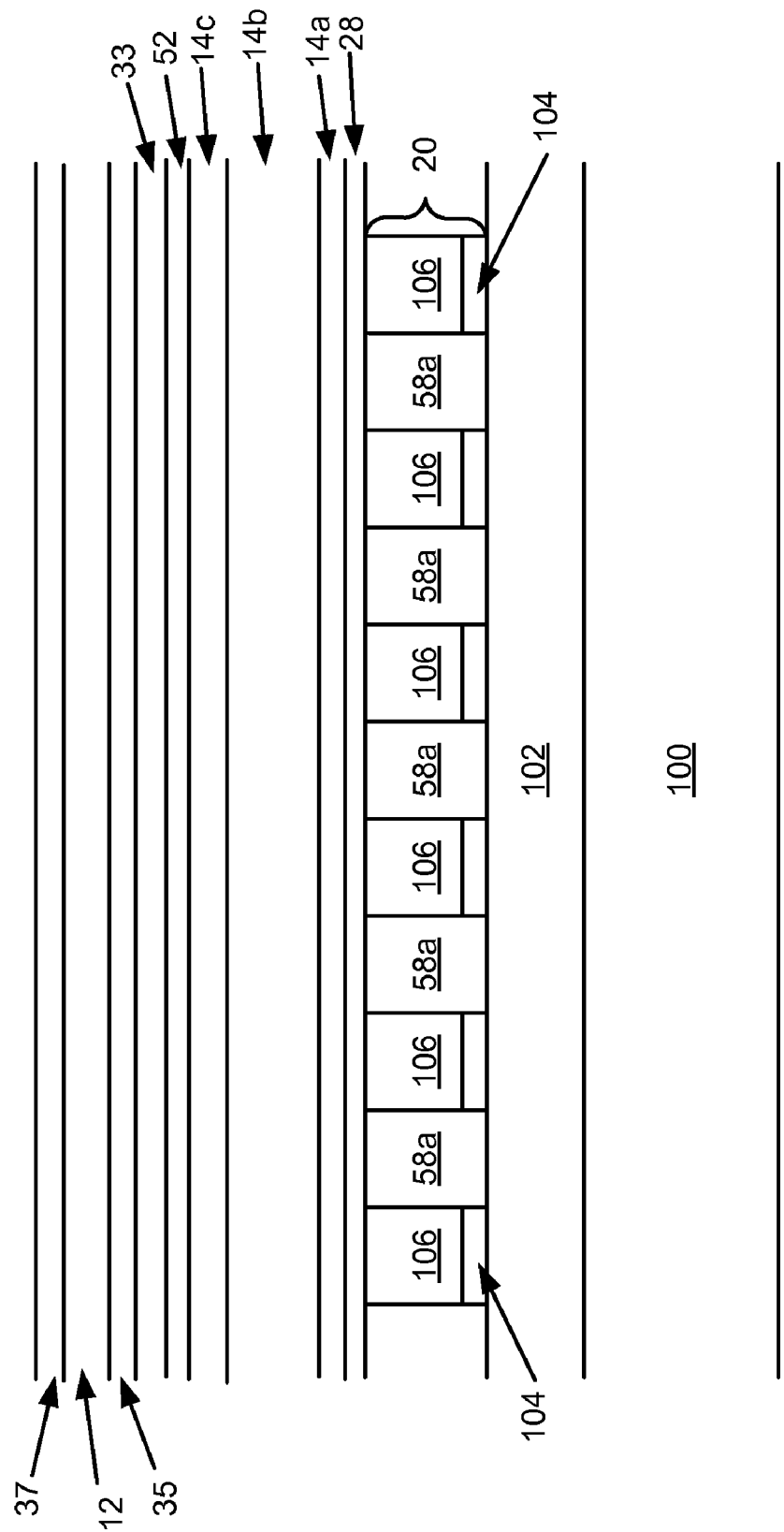

With reference to FIG. 4B, a barrier layer 28 is formed over planarized top surface 110 of substrate 100. Barrier layer 28 may be about 20 to about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 1 and 2A). Each diode may be a vertical upward or downward pointing p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. In at least one embodiment, intrinsic silicon layer 14b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in U.S. patent application Ser. No. 11/298,331, filed Dec. 9, 2005 and titled "Deposited Semiconductor Structure To Minimize N-Type Dopant Diffusion And Method Of Making," which is hereby incorporated by reference herein in its entirety for all purposes).

Heavily doped, p-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include $BF_2$, $BF_3$, B and the like. In some embodiments, an implant dose of about 1-5× $10^{15}$ ions/cm$^2$ may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

A rapid thermal anneal ("RTA") step may be performed to form silicide regions by reaction of silicide-forming metal layer 52 with p+ region 14c. In some embodiments, the RTA may be performed at about 540° C. for about 1 minute, and causes silicide-forming metal layer 52 and the deposited silicon of diode 14 to interact to form a silicide layer, consuming all or a portion of silicide-forming metal layer 52. Following the RTA step, any residual nitride layer from silicide-forming metal layer 52 may be stripped using a wet chemistry. For example, if silicide-forming metal layer 52 includes a TiN top layer, a wet chemistry (e.g., ammonium, peroxide, water in a 1:1:1 ratio) may be used to strip any residual TiN.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., a silicide layer enhances the crystalline structure of silicon diode 14 during annealing). Lower resistivity silicon thereby is provided. Similar results may be achieved for silicon-germanium alloy and/or germanium diodes.

Following the RTA step and the nitride strip step, a barrier layer 33 is formed above silicide-forming metal layer 52. Barrier layer 33 may be about 5 to about 800 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

First conductive carbon layer 35, C-based switching material 12 (e.g., a low-hydrogen, silicon-containing carbon layer) and second conductive carbon layer 37 are formed above barrier layer 33. These layers may be formed by any of a number of different methods as described below.

Silicon Implant to Form Carbon Switching Layer

In a first embodiment, layers 35, 12 and 37 may be formed by depositing a relatively thick low-hydrogen, conductive carbon layer and then implanting silicon into a central region of the layer to form the low-hydrogen, silicon-containing carbon switching material 12 surrounded by first and second conductive carbon layers 35 and 37, respectively. For example, about 5 to 20 nanometers, more generally about 2-400 nanometers, of amorphous carbon may be deposited over barrier layer 33, such as by plasma enhanced chemical vapor deposition ("PECVD") using $C_2H_2$ gas at about 550° C. and about 5 Torr pressure. Other precursors, temperatures and/or pressures may be used. An RTA then may be performed on the amorphous carbon film to convert the carbon film to primarily sp$^2$ bonded carbon having a lower resistivity, and to promote outgassing of hydrogen from the carbon film. Exemplary anneal conditions include rapid thermal annealing at about 700° C. for about 60 seconds, although other temperatures and/or times may be used. Other deposition techniques may be used to form the low-hydrogen carbon layer, such as sputtering a graphite target.

Dopants such as nitrogen or boron may be included in the carbon layer. For example, nitrogen may implanted at an energy of about 2.8 kV with a dose between about $1\times10^{16}$-$6\times10^{16}$ atoms/cm$^2$, $2.4\times10^{16}$ atoms/cm$^2$ in some embodiments and in the range of 1-5 atm %. Boron may implanted at an energy of about 3 kV with a dose between about $1\times10^{16}$-$6\times10^{16}$ atoms/cm$^2$, $2.5\times10^{16}$ atoms/cm$^2$ in some embodiments, and in the range of 1-5 atm %. Other dopants, implant energies and/or implant doses may be used. In some embodiments, the resultant film will have a resistivity of not more than about $50\times10^{-6}$ Ohm-cm-$100\times10^{-3}$ Ohm-cm, and in some embodiments about $1\times10^{-3}$-$10\times10^{-3}$ Ohm-cm. Other resistivity values may be used.

Following formation of the relatively thick carbon layer, silicon may be implanted into the carbon layer to form a low-hydrogen, silicon-containing carbon layer (C-based switching material 12). For instance, about $1\times10^{15}$-$3\times10^{18}$ atoms/cm$^2$, and in some embodiments about $1\times10^{17}$-$1\times10^{18}$ atoms/cm$^2$ of silicon may be implanted into the carbon layer at an energy between about 1.5-5 kV, or 2.5-2.8 kV in other embodiments. A post implant anneal is optional. Implanting the silicon into the carbon layer creates a region of higher resistivity material. Specifically, a low-hydrogen, silicon containing carbon layer (C-based switching material 12) is formed that is surrounded by conductive carbon layers defined by the implant (e.g., first and second conductive carbon layers 35 and 37, respectively).

In some embodiments, the low-hydrogen, silicon containing carbon layer (C-based switching material 12) may have a thickness of about 0.5-200 nanometers, and in some embodiments about 1-5 nanometers. The silicon content of carbon material 12 may range from about 0.0001-60 atm %, and in some embodiments about 30-40 atm %. The resistivity of carbon material 12 may range from about $10$-$1\times10^8$ Ohm-cm, and in some embodiments $1\times10^3$-$1\times10^5$ Ohm-cm. Other thicknesses, amounts of silicon and/or resistivities may be used. C-based switching material 12 may have a hydrogen content of less than about 10%, in some embodiments less than about 5% and in some embodiments between about 1-5%.

In some embodiments, the resultant first and second conductive carbon layers 35 and 37, respectively, may have thicknesses of about 1-100 nanometers, and in some embodiments about 5-20 nanometers. Exemplary resistivity values for the first and second conductive carbon layers range from about $50\times10^{-6}$ Ohm-cm-$100\times10^{-3}$ Ohm-cm, and in some embodiments about $1\times10^{-3}$-$10\times10^{-3}$ Ohm-cm. Other thicknesses and/or resistivity values may be used. Some incorporation of silicon in the first and second conductive carbon layers 35 and 37 may improve the adhesion properties of first and second conductive carbon layers 35 and 37. In addition, during silicon implant, the Si atoms move through a first portion of the carbon layer without being stopped. The implanted Si atoms may induce enhanced sp$^2$-formation in carbon layer 37 while passing through it, and can enhance the conductivity in carbon layer 37.

Sputter Formed Carbon Switching Layer

In a second embodiment, first conductive carbon layer 35, C-based switching material 12, and second conductive carbon layer 37 may be formed separately and/or sequentially. For example, following formation of barrier layer 33, an amorphous carbon layer may be deposited over barrier layer 33 (e.g., by PECVD), optionally implanted with nitrogen or boron and/or annealed to form a conductive carbon layer having primarily sp$^2$ bonded carbon that serves as first conductive carbon layer 35. First conductive carbon layer 35 may have a thickness of about 1-100 nanometers, and in some embodiments about 5-20 nanometers. Exemplary resistivity values for first conductive carbon layer 35 range from about $50\times10^{-6}$ Ohm-cm-$100\times10^{-3}$ Ohm-cm, and in some embodiments about $1\times10^{-3}$-$10\times10^{-3}$ Ohm-cm. Other thicknesses and/or resistivity values may be used.

In other embodiments, first conductive carbon layer 35 may comprise a metal carbide. A metal carbide conductive carbon layer may be formed, for example, by sputtering a suitable carbide target. Exemplary carbide layers that may be used as first conductive carbon layer 35 include TaC, WC, TaCN, WCN, or the like. Exemplary thicknesses ranges for such metal carbide layers range from about 1-100 nanometers, and in some embodiments from about 2-10 nanometers. In some embodiments, the metal carbide layers may have a thickness of about 5 nanometers or less. Exemplary resistivity values range from about $50\times10^{-6}$ Ohm-cm-$100\times10^{-3}$ Ohm-cm, and in some embodiments about $1\times10^{-4}$-$10\times10^{-4}$ Ohm-cm. Other thicknesses and/or resistivity values may be used. Table 1 provides exemplary process parameters for formation of a metal carbide layer that may be used as first conductive carbon layer 35 (or second conductive carbon layer 37). Other flow rates, pressures, temperatures, powers and/or spacings may be used.

TABLE 1

EXEMPLARY PROCESS PARAMETERS
FOR SPUTTERING METAL CARBIDE TARGET

| PROCESS PARAMETER | 1$^{ST}$ EXAMPLE RANGE | 2$^{ND}$ EXAMPLE RANGE |
|---|---|---|
| ARGON FLOW (SCCM) | 5-100 | 8-15 |
| PRESSURE (milliTorr) | 0.6-40 | 2-8 |
| SUBSTRATE TEMP (° C.) | 200-550 | 200-550 |
| TARGET RF POWER (WATTS/CM$^2$ @ 13.56 MHZ) | 1-3.5 | 1-3.5 |
| TARGET-SUBSTRATE SPACING (mm) | 22-37 | 22-37 |

Following formation of first conductive carbon layer 35, C-based switching material 12 may be formed over first conductive carbon layer 35. As stated, C-based switching material 12 comprises a low-hydrogen, silicon-containing carbon layer. In some embodiments, such a layer may be formed by sputtering a graphite target (see Table 2 below) to form a low-hydrogen carbon layer and then implanting silicon into the carbon layer to form a low-hydrogen, silicon-containing carbon layer that serves as C-based switching material 12. Silicon implant doses and energies similar to those described previously may be employed.

Alternatively, a low-hydrogen, silicon-containing carbon layer may be formed by sputtering a silicon carbide target (see Table 3 below) or sputtering a silicon target in the presence of a carbon containing gas such as CH$_4$ or another similar gas (see Table 4 below). Tables 2-4 provide exemplary process parameters for formation of a low-hydrogen, silicon-containing carbon film that may be used as a C-based switching material. Other flow rates, pressures, temperatures, powers and/or spacings may be used.

TABLE 2

EXEMPLARY PROCESS PARAMETERS
FOR SPUTTERING GRAPHITE TARGET

| PROCESS PARAMETER | 1$^{ST}$ EXAMPLE RANGE | 2$^{ND}$ EXAMPLE RANGE |
|---|---|---|
| ARGON FLOW (SCCM) | 5-100 | 8-15 |
| PRESSURE (milliTorr) | 0.6-40 | 2-8 |
| SUBSTRATE TEMP (° C.) | 200-550 | 200-550 |

TABLE 2-continued

EXEMPLARY PROCESS PARAMETERS
FOR SPUTTERING GRAPHITE TARGET

| PROCESS PARAMETER | $1^{ST}$ EXAMPLE RANGE | $2^{ND}$ EXAMPLE RANGE |
|---|---|---|
| TARGET RF POWER (WATTS/CM² @ 13.56 MHZ) | 1-3.5 | 1-3.5 |
| TARGET-SUBSTRATE SPACING (mm) | 22-37 | 22-37 |

TABLE 3

EXEMPLARY PROCESS PARAMETERS
FOR SPUTTERING SiC TARGET

| PROCESS PARAMETER | $1^{ST}$ EXAMPLE RANGE | $2^{ND}$ EXAMPLE RANGE |
|---|---|---|
| ARGON FLOW (SCCM) | 5-100 | 8-15 |
| PRESSURE (milliTorr) | 0.6-40 | 2-8 |
| SUBSTRATE TEMP (° C.) | 200-550 | 200-550 |
| TARGET RF POWER (WATTS/CM² @ 13.56 MHZ) | 1-3.5 | 1-3.5 |
| TARGET-SUBSTRATE SPACING (mm) | 22-37 | 22-37 |

TABLE 4

EXEMPLARY PROCESS PARAMETERS
FOR SPUTTERING Si TARGET

| PROCESS PARAMETER | $1^{ST}$ EXAMPLE RANGE | $2^{ND}$ EXAMPLE RANGE |
|---|---|---|
| ARGON FLOW (SCCM) | 5-100 | 8-15 |
| CH₄ FLOW (SCCM) | 0.1-100 | 0.1-3 |
| PRESSURE (milliTorr) | 0.6-40 | 2-8 |
| SUBSTRATE TEMP (° C.) | 200-550 | 200-550 |
| TARGET RF POWER (WATTS/CM² @ 13.56 MHZ) | 1-3.5 | 1-3.5 |
| TARGET-SUBSTRATE SPACING (mm) | 22-37 | 22-37 |

In some embodiments, the resultant low-hydrogen, silicon-containing carbon layer (C-based switching material 12) may have a thickness of about 0.5-200 nanometers, and is some embodiments about 1-5 nanometers. The silicon content of C-based switching material 12 may range from about 0.0001-60 atm %, and in some embodiments 30-40 atm %. The resistivity of C-based switching material 12 may range from about 10-1×10⁸ Ohm-cm, and in some embodiments 1×10³-1×10⁵ Ohm-cm. Other thicknesses, amounts of silicon and/or resistivities may be used. C-based switching material 12 may have a hydrogen content of less than about 10%, in some embodiments less than about 5% and in some embodiments between about 1-5%.

Following formation of the low-hydrogen, silicon-containing carbon layer that serves as C-based switching material 12, second conductive carbon layer 37 is formed over C-based switching material 12. Second conductive carbon layer 37 may be similar to first conductive carbon layer 35 (and similarly formed). For example, second conductive carbon layer 37 may comprise an amorphous carbon layer deposited over C-based switching material 12 (e.g., by PECVD), implanted with nitrogen or boron and/or annealed to form a conductive carbon layer having primarily sp² bonded carbon that server as second conductive carbon layer 37. Second conductive carbon layer 37 may have a thickness of about 1-100 nanometers, and in some embodiments about 5-20 nanometers. Exemplary resistivity values for second conductive carbon layer 37 range from about 50×10⁻⁶ Ohm-cm-100×10⁻³ Ohm-cm, and in some embodiments about 1-10×10⁻³ Ohm-cm. Other thicknesses and/or resistivity values may be used.

In other embodiments, second conductive carbon layer 37 may comprise a metal carbide. A metal carbide, conductive carbon layer may be formed, for example, by sputtering a suitable carbide target. Exemplary carbide layers that may be used as second conductive carbon layer 37 include TaC, WC, TaCN, WCN, or the like. Exemplary thicknesses ranges for such metal carbide layers range from about 1-100 nanometers, and in some embodiments about 2-10 nanometers. Exemplary resistivity values range from about 50×10⁻⁶ Ohm-cm-100×10⁻³ Ohm-cm, and in some embodiments from about 1-10×10⁻⁴ Ohm-cm. Other thicknesses and/or resistivity values may be used.

C-based switching material 12 may be a low-hydrogen, silicon-containing carbon switching layer having silicon present to increase the resistivity of the carbon layer to a level compatible with the current capabilities of steering element 14. In some embodiments, the silicon content of C-based switching material 12 may be about 30-40 atm % or more, and the hydrogen content may be between about 1-5%. Other silicon and/or hydrogen levels may be present.

First conductive carbon layer 35 and second conductive carbon layer 37 serve as high current density sustaining electrodes for MIM stack 27 (FIG. 2A). First and second conductive carbon layers 35 and 37 allow high current densities produced during switching of C-based switching material 12 to be distributed safely to metallization layers used in memory cell 10 such as barrier layers 26 and 33, as well as top conductor 22.

Figure 4C:
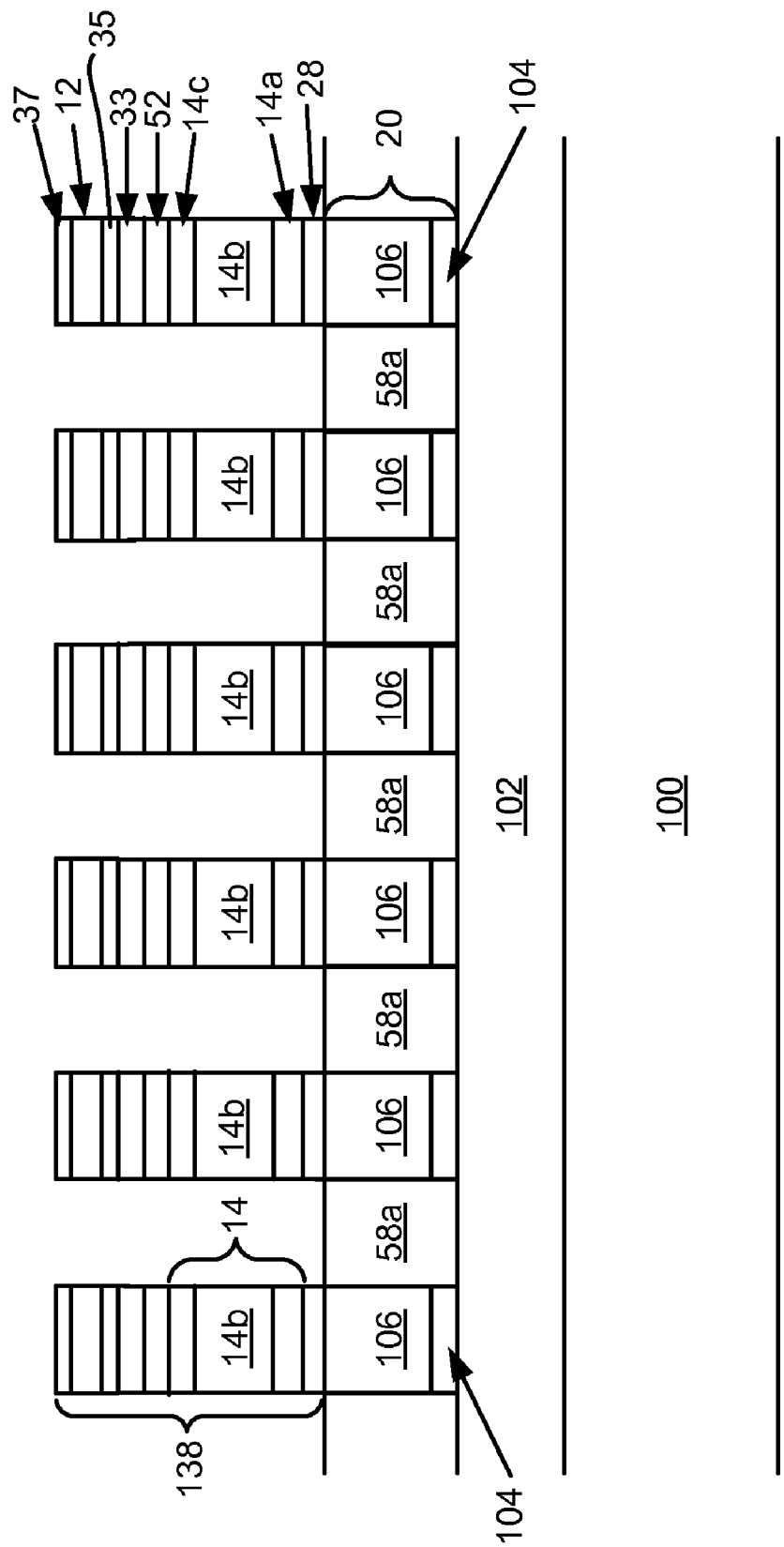
Figure 4D:
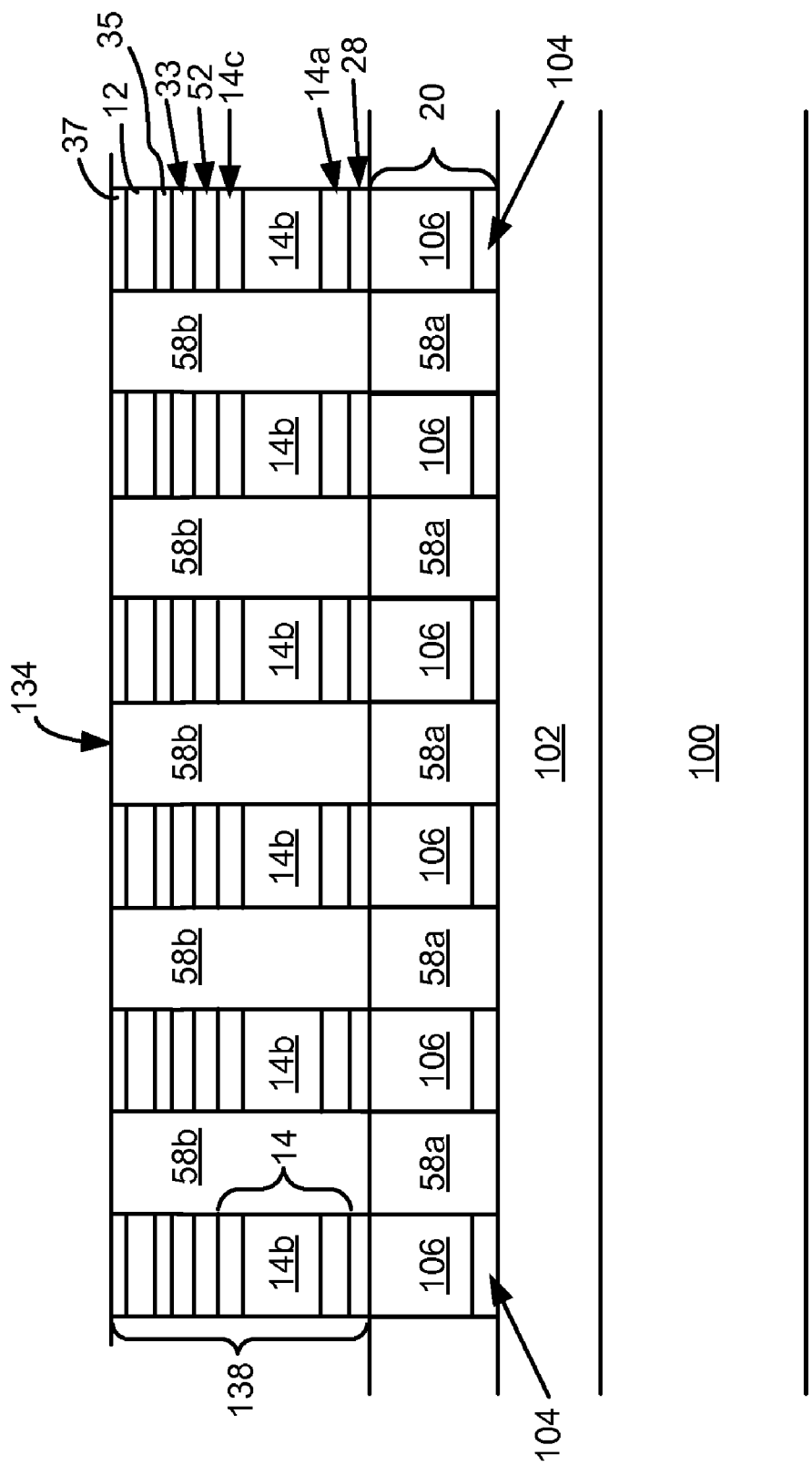

As shown in FIG. 4C, second conductive carbon layer 37, C-based switching material 12, first conductive carbon layer 35, barrier layer 33, silicide-forming metal layer 52, diode layers 14a-14c and barrier layer 28 are patterned and etched to form pillars 138. In some embodiments, pillars 138 may have about the same pitch and about the same width as conductors 20 below, such that each pillar 138 is formed on top of a conductor 20. Some misalignment may be tolerated.

In at least one embodiment, photoresist may be deposited and patterned using standard photolithography techniques to produce a hard-mask, which does not need to be removed with a oxygen plasma. After patterning the hard mask, the photoresist may be removed and layers 28, 14a-14c, 52, 33, 35, 12 and 37 then may be etched. The hard mask may be formed on top of second conductive carbon layer 37, with bottom antireflective coating ("BARC") on top, then patterned and etched. Similarly, dielectric antireflective coating ("DARC") may be used as a hard mask.

Pillars 138 may be formed using any suitable masking and etching process. For example, layers 28, 14a-14c, 52, 33, 35, 12 and 37 may be patterned with about 100 to about 500 nm hard mask. Thinner or thicker hard mask layers may be used with smaller critical dimensions and technology nodes.

Any suitable etch chemistries, and any suitable etch parameters, flow rates, chamber pressures, power levels, process temperatures, and/or etch rates may be used. In some embodiments, second conductive carbon layer 37, C-based switching material 12, first conductive carbon layer 35, barrier layer 33, silicide-forming metal layer 52, diode layers 14a-14c and barrier layer 28 may be patterned using a single etch step. In other embodiments, separate etch steps may be used. The etch proceeds down to dielectric layer 58a.

After etching, pillars 138 may be cleaned using a dilute hydrofluoric/sulfuric acid clean. Such cleaning, whether or not photoresist asking is performed before etching, may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for 60 seconds. Megasonics may or may not be used.

After pillars 138 have been cleaned, a dielectric layer 58*b* may be deposited over pillars 138 to fill the voids between pillars 138. For example, approximately 200-7000 angstroms of silicon dioxide may be deposited and planarized using chemical mechanical polishing or an etchback process to remove excess dielectric material 58*b* and form a planar surface 134, resulting in the structure illustrated in FIG. 4D. Planar surface 134 includes exposed regions of second conductive carbon layer 37 separated by dielectric material 58*b* (as shown). Other dielectric materials such as silicon nitride, silicon oxynitride, low K dielectrics, etc., and/or other dielectric layer thicknesses may be used.

Figure 4E:
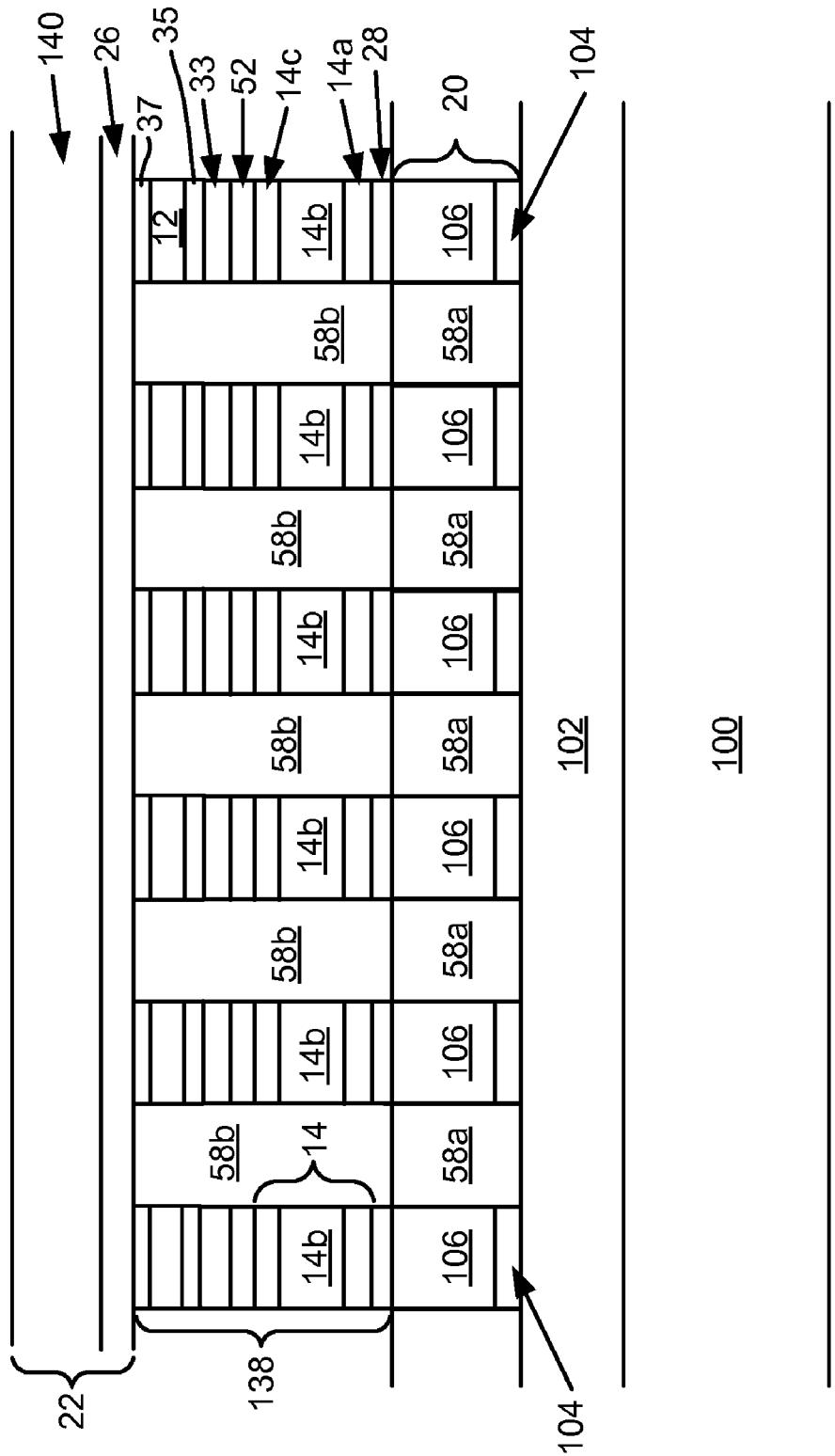

With reference to FIG. 4E, second conductors 22 may be formed above pillars 138 in a manner similar to the formation of first conductors 20. For example, in some embodiments, one or more barrier layers and/or adhesion layers 26 may be deposited over pillars 138 prior to deposition of a conductive layer 140 used to form second conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten nitride, tungsten, molybdenum, combinations of one or more layers, or any other suitable material(s). The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of silicide-forming metal layer 52 with p+ region 14*c*). The lattice spacing of titanium silicide and cobalt silicide are close to that of silicon, and it appears that silicide layers may serve as "crystallization templates" or "seeds" for adjacent deposited silicon as the deposited silicon crystallizes (e.g., a silicide layer enhances the crystalline structure of silicon diode 14 during annealing at temperatures of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Persons of ordinary skill in the art will understand that alternative memory cells in accordance with this invention may be fabricated by other similar techniques.

In some embodiments in accordance with this invention, following formation of C-based switching material 12, an anneal step may be performed prior to depositing additional material. In particular, the anneal may be performed in a vacuum or the presence of one or more forming gases, at a temperature in the range from about 350° C. to about 900° C., for about 30 to about 180 minutes. The anneal preferably is performed in about an 80% ($N_2$):20% ($H_2$) mixture of forming gases, at about 625° C. for about one hour.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 mT to about 760 T, whereas preferred pressures may range from about 300 mT to about 600 mT.

A queue time of preferably about 2 hours between the anneal and the deposition of additional layers preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that carbon-based switching material may absorb water from the air over time. Likewise, it is believed that the moisture may increase the likelihood of de-lamination of the carbon-based switching material. In some cases, it also might be acceptable to have a queue time of 2 hours from the time of deposition of carbon-based switching material to deposition of additional layers, skipping the anneal altogether.

Incorporation of such a post-carbon-formation-anneal preferably takes into account other layers of the memory cell, because these other memory cell layers will also be subject to the anneal. For example, the anneal may be omitted or its parameters may be adjusted where the aforementioned preferred anneal parameters would damage the other memory cell layers. The anneal parameters may be adjusted within ranges that result in the removal of moisture without damaging the layers of the annealed memory cell. For instance, the temperature may be adjusted to stay within an overall thermal budget of a memory cell being formed. Likewise, any suitable forming gases, temperatures and/or durations may be used that are appropriate for a particular memory cell. In general, such an anneal may be used with any carbon-based switching material, such as CNT material, graphite, graphene, amorphous carbon, amorphous DLC, silicon carbide, boron carbide and other crystalline forms of carbon.

The foregoing description discloses only exemplary embodiments of the invention. Modifications of the above disclosed apparatus and methods which fall within the scope of the invention will be readily apparent to those of ordinary skill in the art. For instance, other pillar shapes may be used. Any suitable material may be used for conductors 20 and 22 such as copper, aluminum or other conductive layers. Accordingly, although the present invention has been disclosed in connection with exemplary embodiments thereof, it should be understood that other embodiments may fall within the spirit and scope of the invention, as defined by the following claims.

The invention claimed is:

1. A method of forming a memory cell, the method comprising:
   forming a metal-insulator-metal ("MIM") stack, the MIM stack including:
      a first conductive carbon layer;
      a low-hydrogen, silicon-containing carbon layer above the first conductive carbon layer; and
      a second conductive carbon layer above the low-hydrogen, silicon-containing carbon layer; and
   forming a steering element coupled to the MIM stack.

2. The method of claim 1, wherein the first and second conductive carbon layers comprise carbon layers that include primarily $sp^2$ bonded carbon.

3. The method of claim 1, wherein the first and second conductive carbon layers have a resistivity of not more than about $100 \times 10^{-3}$ Ohm-cm.

4. The method of claim 1, wherein the first and second conductive carbon layers have a resistivity of not more than about $10 \times 10^{-3}$ Ohm-cm.

5. The method of claim 1, wherein the first and second conductive carbon layers comprise metal carbide layers.

6. The method of claim 1, wherein the low-hydrogen, silicon-containing carbon layer comprises at least about 30 atm % silicon.

7. The method of claim 1, wherein the low-hydrogen, silicon-containing carbon layer comprises at least about 40 atm % silicon.

8. The method of claim 1, wherein the low-hydrogen, silicon-containing carbon layer has a resistivity of at least about $1 \times 10^3$ ohm-cm.

9. The method of claim 1, wherein the low-hydrogen, silicon-containing carbon layer has a resistivity of at least about $1 \times 10^5$ ohm-cm.

10. The method of claim 1, wherein forming the MIM stack comprises:
    forming the first conductive carbon layer;
    forming the low-hydrogen, silicon-containing carbon layer over the first conductive layer; and
    forming the second conductive carbon layer over the low-hydrogen, silicon-containing carbon layer.

11. The method of claim 10, wherein forming the low-hydrogen, silicon-containing carbon layer over the first conductive carbon layer comprises sputtering a graphite target to form a carbon layer and implanting silicon into the carbon layer.

12. The method of claim 10, wherein forming the low-hydrogen, silicon-containing carbon layer over the first conductive carbon layer comprises sputtering a silicon carbide target.

13. The method of claim 10, wherein forming at least one of the first conductive carbon layer and the second conductive carbon layer comprises depositing amorphous carbon and annealing the amorphous carbon to form primarily $sp^2$ bonded carbon.

14. The method of claim 10, wherein forming at least one of the first conductive carbon layer and the second conductive carbon layer comprises sputtering a carbide target.

15. The method of claim 1, wherein forming the MIM stack comprises:
    forming a low-hydrogen conductive carbon layer; and
    implanting silicon into the low-hydrogen conductive carbon layer to form the first conductive carbon layer, the low low-hydrogen, silicon-containing layer and the second conductive carbon layer.

16. The method of claim 1, wherein forming the steering element coupled to the MIM stack comprises forming a polycrystalline semiconductor diode in series with the MIM stack.

17. The method of claim 1, wherein forming the steering element coupled to the MIM stack comprises forming a Schottky diode in series with the MIM stack.

18. A memory cell formed by the method of claim 1.

19. A method of forming a memory cell, the method comprising:
    forming a metal-insulator-metal ("MIM") stack by:
       forming a first conductive carbon layer;
       forming a low-hydrogen, silicon-containing carbon layer over the first conductive carbon layer; and
       forming a second conductive carbon layer over the low-hydrogen, silicon-containing carbon layer; and
    forming a steering element coupled to the MIM stack.

20. The method of claim 19, wherein forming the low-hydrogen, silicon-containing carbon layer over the first conductive carbon layer comprises sputtering a graphite target to form a carbon layer and implanting silicon into the carbon layer.

21. The method of claim 19, wherein forming the low-hydrogen, silicon-containing carbon layer over the first conductive carbon layer comprises sputtering a silicon carbide target.

22. The method of claim 19, wherein forming at least one of the first conductive carbon layer and the second conductive carbon layer comprises depositing amorphous carbon and annealing the amorphous carbon to form primarily $sp^2$ bonded carbon.

23. The method of claim 19, wherein forming at least one of the first conductive carbon layer and the second conductive carbon layer comprises sputtering a carbide target.

24. The method of claim 19, wherein forming the steering element coupled to the MIM stack comprises forming a polycrystalline semiconductor diode in series with the MIM stack.

25. The method of claim 19, wherein forming the steering element coupled to the MIM stack comprises forming a Schottky diode in series with the MIM stack.

26. A memory cell formed by the method of claim 19.

27. A method of forming a memory cell, the method comprising:
    forming a metal-insulator-metal ("MIM") stack by:
       forming a low-hydrogen conductive carbon layer; and
       implanting silicon into the low-hydrogen conductive carbon layer to form a first conductive carbon layer, a low-hydrogen, silicon-containing carbon layer above the first conductive carbon layer and a second conductive carbon layer above the low-hydrogen, silicon-containing carbon layer; and
    forming a steering element coupled to the MIM stack.

28. The method of claim 27, wherein forming the steering element coupled to the MIM stack comprises forming a polycrystalline semiconductor diode in series with the MIM stack.

29. The method of claim 27, wherein forming the steering element coupled to the MIM stack comprises forming a Schottky diode in series with the MIM stack.

30. A memory cell formed by the method of claim 27.

31. A memory cell comprising:
    a metal-insulator-metal ("MIM") stack, the MIM stack including:
       a first conductive carbon layer;
       a low-hydrogen, silicon-containing carbon layer above the first conductive carbon layer; and a second conductive carbon layer above the low-hydrogen, silicon-containing carbon layer; and
a steering element coupled to the MIM stack.

32. The memory cell of claim 31, wherein the first and second conductive carbon layers comprise carbon layers that include primarily sp$^2$ bonded carbon.

33. The memory cell of claim 31, wherein the first and second conductive carbon layers have a resistivity of not more than about $100 \times 10^{-3}$ Ohm-cm.

34. The memory cell of claim 31, wherein the first and second conductive carbon layers have a resistivity of not more than about $10 \times 10^{-3}$ Ohm-cm.

35. The memory cell of claim 31, wherein the first and second conductive carbon layers comprise metal carbide layers.

36. The memory cell of claim 31, wherein the low-hydrogen, silicon-containing carbon layer comprises at least about 30 atm % silicon.

37. The memory cell of claim 31, wherein the low-hydrogen, silicon-containing carbon layer comprises at least about 40 atm % silicon.

38. The memory cell of claim 31, wherein the low-hydrogen, silicon-containing carbon layer has a resistivity of at least about $1 \times 10^3$ ohm-cm.

39. The memory cell of claim 31, wherein the low-hydrogen, silicon-containing carbon layer has a resistivity of at least about $1 \times 10^5$ ohm-cm.

40. A memory cell comprising:
a first conductive rail;
a metal-insulator-metal ("MIM") stack formed above the first conductive rail, the MIM stack including:
a first conductive carbon layer, the first conductive carbon layer having a resistivity of not more than about $100 \times 10^{-3}$ Ohm-cm;
a low-hydrogen, silicon-containing carbon layer above the first conductive carbon layer, the low-hydrogen, silicon-containing carbon layer comprises at least about 30 atm % silicon; and
a second conductive carbon layer above the low-hydrogen, silicon-containing carbon layer, the second conductive carbon layer having a resistivity of not more than about $100 \times 10^{-3}$ Ohm-cm;
a steering element formed above the first conductive rail and in series with the MIM stack; and
a second conductive rail above the MIM stack and steering element.

41. The memory cell of claim 40, wherein the first and second conductive carbon layers comprise carbon layers that include primarily sp$^2$ bonded carbon.

42. The memory cell of claim 40, wherein the first and second conductive carbon layers comprise metal carbide layers.

43. The memory cell of claim 40, wherein the low-hydrogen, silicon-containing layer comprises no more than about 10 atm % hydrogen.

44. The memory cell of claim 40, wherein the low-hydrogen, silicon-containing layer comprises no more than about 5 atm % hydrogen.

45. A method of forming a metal-insulator-metal ("MIM") stack, the method comprising:
forming a first conductive carbon layer;
forming a low-hydrogen, silicon-containing carbon layer over the first conductive carbon layer; and
forming a second conductive carbon layer over the low-hydrogen, silicon-containing carbon layer.

46. The method of claim 45, wherein forming the low-hydrogen, silicon-containing carbon layer over the first conductive carbon layer comprises sputtering a graphite target to form a carbon layer and implanting silicon into the carbon layer.

47. The method of claim 45, wherein forming the low-hydrogen, silicon-containing carbon layer over the first conductive carbon layer comprises sputtering a silicon carbide target.

48. The method of claim 45, wherein forming at least one of the first conductive carbon layer and the second conductive carbon layer comprises depositing amorphous carbon and annealing the amorphous carbon to form primarily sp$^2$ bonded carbon.

49. The method of claim 45, wherein forming at least one of the first conductive carbon layer and the second conductive carbon layer comprises sputtering a carbide target.

50. The method of claim 45, wherein the low-hydrogen, silicon-containing layer comprises no more than about 10 atm % hydrogen.

51. The method of claim 45, wherein the low-hydrogen, silicon-containing layer comprises no more than about 5 atm % hydrogen.

52. A method of forming a metal-insulator-metal ("MIM") stack, the method comprising:
forming a low-hydrogen conductive carbon layer; and
implanting silicon into the low-hydrogen conductive carbon layer to form a first conductive carbon layer, a low-hydrogen, silicon-containing carbon layer above the first conductive carbon layer and a second conductive carbon layer above the low-hydrogen, silicon-containing carbon layer.

53. A metal-insulator-metal ("MIM") stack comprising:
a first conductive carbon layer;
a low-hydrogen, silicon-containing carbon layer above the first conductive carbon layer; and
a second conductive carbon layer above the low-hydrogen, silicon-containing carbon layer.

54. The MIM stack of claim 53, wherein the first and second conductive carbon layers comprise carbon layers that include primarily sp$^2$ bonded carbon.

55. The MIM stack of claim 53, wherein the first and second conductive carbon layers comprise metal carbide layers.

* * * * *